United States Patent
Lin et al.

(10) Patent No.: US 10,199,995 B2
(45) Date of Patent: Feb. 5, 2019

(54) PROGRAMMABLE AMPLIFIER CIRCUIT CAPABLE OF PROVIDING LARGE OR LARGER RESISTANCE FOR FEEDBACK PATH OF ITS AMPLIFIER

(71) Applicant: MEDIATEK INC., Hsin-Chu (TW)

(72) Inventors: Chen-Chien Lin, Hsinchu (TW); Sung-Han Wen, Taipei (TW); Yu-Cheng Chang, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/434,061

(22) Filed: Feb. 16, 2017

(65) Prior Publication Data

US 2017/0288617 A1    Oct. 5, 2017

Related U.S. Application Data

(60) Provisional application No. 62/315,638, filed on Mar. 30, 2016.

(51) Int. Cl.
| | |
|---|---|
| *H03F 3/00* | (2006.01) |
| *H03F 3/45* | (2006.01) |
| *H03G 1/00* | (2006.01) |
| *H03G 3/00* | (2006.01) |

(52) U.S. Cl.
CPC ......... *H03F 3/005* (2013.01); *H03F 3/45475* (2013.01); *H03G 1/0094* (2013.01); *H03G 3/001* (2013.01); *H03F 2200/504* (2013.01); *H03F 2203/45512* (2013.01); *H03F 2203/45514* (2013.01); *H03F 2203/45526* (2013.01); *H03F 2203/45528* (2013.01); *H03F 2203/45594* (2013.01)

(58) Field of Classification Search
CPC ...................................................... H03F 3/005
USPC ............................................................ 330/127
See application file for complete search history.

(56) References Cited

U.S. PATENT DOCUMENTS

| | | | |
|---|---|---|---|
| 6,392,219 B1 * | 5/2002 | McCormick | H04B 10/6931 250/214 R |
| 8,638,165 B2 | 1/2014 | Shah | |
| 9,590,801 B1 * | 3/2017 | Shringarpure | H04L 25/03159 |
| 2003/0169104 A1 * | 9/2003 | Huckins | H03F 1/086 330/69 |
| 2008/0111560 A1 | 5/2008 | Regier | |
| 2010/0156535 A1 | 6/2010 | Nicollini | |

(Continued)

OTHER PUBLICATIONS

Barbieri, 100 + dB A-Weighted SNR Microphone Preamplifier With On-Chip Decoupling Capacitors, Oct. 8, 2012, pp. 2737-2750, vol. 47, Issue 11, IEEE Journal of Solid-State Circuits, Italy.

*Primary Examiner* — Patricia T Nguyen
(74) *Attorney, Agent, or Firm* — Wolf, Greenfield & Sacks, P.C.

(57) ABSTRACT

A programmable amplifier circuit includes an amplifier, an input capacitor coupled to an input of the amplifier, a feedback capacitor coupled to the input of the amplifier and an output of the amplifier, and a switched-capacitor resistor circuit. The switched-capacitor resistor circuit is coupled between the input of the amplifier and the output of the amplifier, and configured for simulating a feedback resistor element to provide a resistance for a feedback path of the amplifier by using at least one capacitor placed between the input of the amplifier and the output of the amplifier to avoid leakage current(s) flowing back to an input of the amplifier.

18 Claims, 7 Drawing Sheets

(56) References Cited

U.S. PATENT DOCUMENTS

| | | | | |
|---|---|---|---|---|
| 2011/0043279 A1* | 2/2011 | Adachi | ............... | H03F 3/187 330/86 |
| 2011/0140785 A1* | 6/2011 | Lian | ............... | H03F 3/187 330/293 |
| 2012/0306575 A1 | 12/2012 | Shah | | |
| 2013/0208922 A1* | 8/2013 | Nicollini | ............... | H03F 1/30 381/120 |
| 2014/0077882 A1* | 3/2014 | Draxelmayr | ............... | H03F 3/005 330/282 |
| 2015/0270806 A1* | 9/2015 | Wagh | ............... | H03F 3/211 330/296 |
| 2015/0280660 A1 | 10/2015 | Azin | | |
| 2017/0026030 A1* | 1/2017 | Kang | ............... | H03G 1/0029 |

\* cited by examiner

PROGRAMMABLE AMPLIFIER CIRCUIT CAPABLE OF PROVIDING LARGE OR LARGER RESISTANCE FOR FEEDBACK PATH OF ITS AMPLIFIER

CROSS REFERENCE TO RELATED APPLICATIONS

This application claims priority of U.S. provisional application Ser. No. 62/315,638 filed on Mar. 30, 2016, which is entirely incorporated herein by reference.

BACKGROUND

The invention relates to an amplifier scheme, and more particularly to an amplifier circuit capable of providing a large or larger actual resistance for its closed feedback loop to completely avoid leakage currents flowing back to input(s) of an amplifier.

For signal processing, a conventional scheme may adopt a conventional AC-coupled amplifier or a conventional DC-coupled amplifier to process an input signal with a programmable gain. For implementation, an input capacitor at the input of the conventional AC-coupled amplifier corresponds to a very large capacitance and is usually placed on an external printed circuit board but not included within the integrated circuit of the amplifier, which is not cost-effective. To solve the problems of conventional AC-coupled amplifier, the conventional DC-coupled amplifier adopts a different circuit structure in which its gain is determined based on the input capacitance and a feedback capacitance, and thus the input capacitance can be designed to become smaller.

However, the conventional DC-coupled amplifier circuit has leakage currents flowing through its feedback resistors back to input(s) of an amplifier of the conventional DC-coupled amplifier circuit, which inevitably causes that the actual resistances of its feedback resistors decrease and become smaller than the resistances designed by user(s). This will be a more serious problem when the resistances are designed to be a larger value by the user(s) for some application fields such as audio signal processing.

SUMMARY

Therefore one of the objectives of the invention is to provide a novel feedback circuit capable of providing a large or larger resistance for the feedback closed loop of an amplifier, to solve the problems mentioned above. The novel feedback circuit comprises a switched-capacitor resistor circuit and/or a voltage scaling circuit.

According to embodiments of the invention, a programmable amplifier circuit is disclosed. The programmable amplifier circuit comprises an amplifier, an input capacitor coupled to an input of the amplifier, a feedback capacitor coupled to the input of the amplifier and an output of the amplifier, and a voltage scaling circuit. The voltage scaling circuit is coupled between the input of the amplifier and the output of the amplifier and configured for simulating a feedback resistor element to scale down a voltage amplitude of a signal generated from the output of the amplifier to generate a feedback signal to the input of the amplifier.

According to the embodiments, a programmable amplifier circuit is disclosed. The programmable amplifier circuit comprises an amplifier, an input capacitor coupled to an input of the amplifier, a feedback capacitor coupled to the input of the amplifier and an output of the amplifier, and a switched-capacitor resistor circuit. The switched-capacitor resistor circuit is coupled between the input of the amplifier and the output of the amplifier, and configured for simulating a feedback resistor element to provide a resistance for a feedback path of the amplifier by using at least one capacitor placed between the input of the amplifier and the output of the amplifier to avoid leakage current(s) flowing back to an input of the amplifier.

According to the embodiments, the amplifier comprised by the programmable amplifier circuit can be a differential amplifier, and the programmable amplifier circuit comprises two switched-capacitor resistor circuits having similar operations and function mentioned above.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

In embodiments of the invention, unlike a conventional switched-capacitor resistor, a novel switched-capacitor resistor is provided to be used as a resistor element on the feedback path between the input and output of an amplifier, to avoid that the actual resistance of the resistor element is affected by leakage currents (i.e. channel leakages) flowing back to the input of the amplifier. In addition, in various modifications, the novel switched-capacitor resistor can be connected to another novel switched-capacitor resistor in a cascaded structure, i.e. two stages of novel switched-capacitor resistors, to form the resistor element on the feedback path between the input and output of the amplifier. It should be noted that in other embodiment more than two stages of novel switched-capacitor resistors may be connected in a cascaded structure. In addition, a voltage scaling circuit can be employed to scale down the voltage amplitude of the signal passing through the feedback path of the amplifier, to simulate the function of a resistor element to generate a feedback signal to the output of the amplifier. Either the novel switched-capacitor resistor or the voltage scaling circuit can be used to simulate a resistor element capable of providing a large or larger resistance for the feedback loop of the amplifier. Various embodiments are illustrated in the following.

Figure 1:
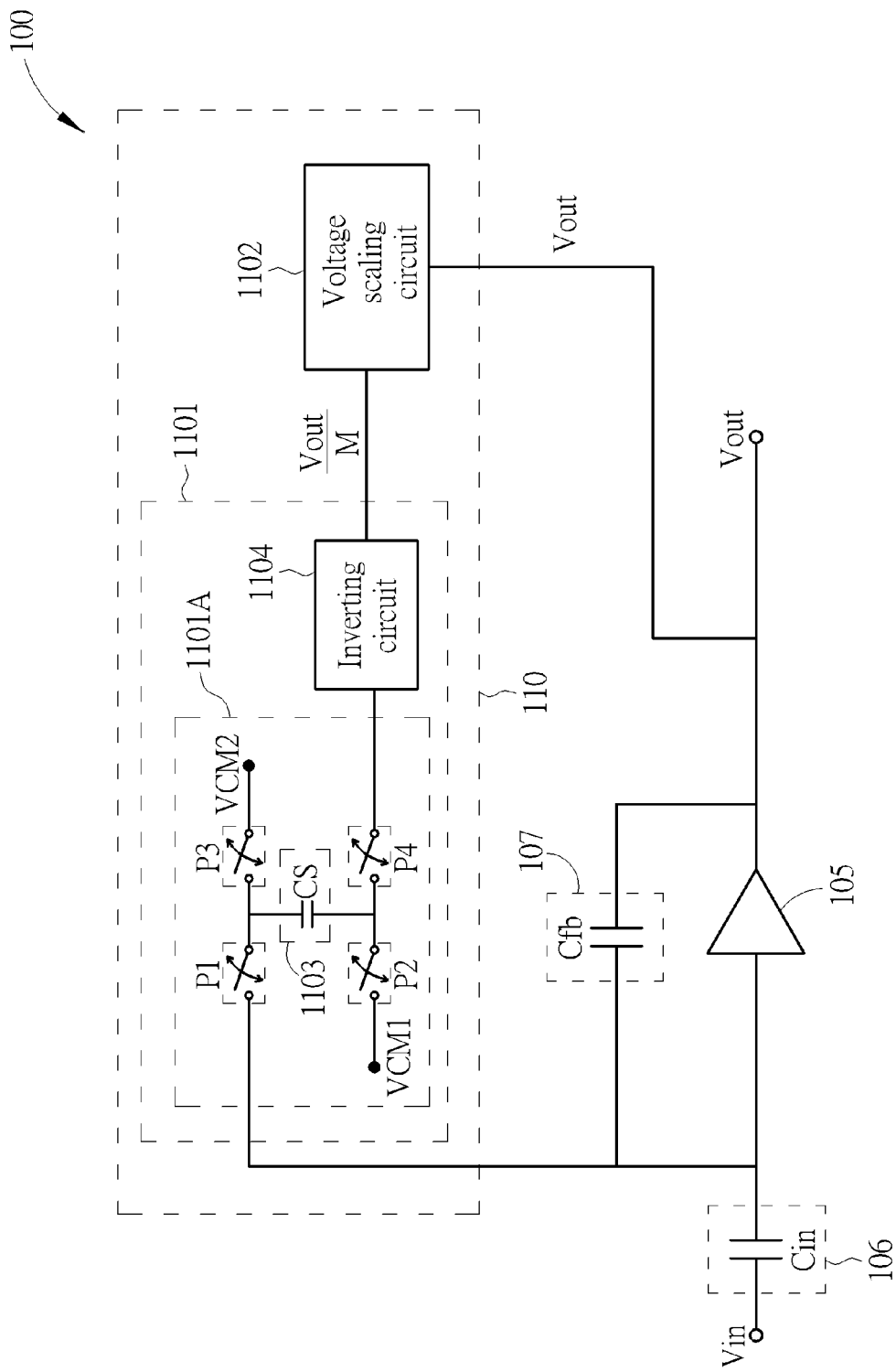
FIG. 1 is a diagram of programmable amplifier circuit according to a first embodiment of the invention.

FIG. 1 is a diagram of an amplifier circuit 100 according to a first embodiment of the invention. The amplifier circuit 100 comprises an amplifier 105, an input capacitor 106 coupled to the input of the amplifier 105 and for receiving an input signal Vin, a feedback capacitor 107 coupled between the input and output of amplifier 105, a feedback circuit 110 coupled between the input and output of amplifier 105. The amplifier circuit 100 is a novel DC-coupled programmable gain amplifier (PGA), and the gain of amplifier circuit 100 is determined based on the capacitance Cin of the capacitor 106 and the capacitance Cfb of the capacitor 107 and can be adjusted to be of different gain values according to different capacitances. The output signal Vout is generated at the output of the amplifier 105. The feedback circuit 110 is placed on a feedback closed-loop of the amplifier 105 and is arranged for simulating a resistor element capable of providing a large or larger resistance for the feedback closed-loop. The feedback circuit 110 can provide the large or larger resistance for the system of the amplifier circuit 100, to maintain/improve the stability. The gain function H(s) of amplifier circuit 100 can be represented by the following equation:

$$H(s) = \frac{Vout(s)}{Vin(s)} = \frac{s\left(\frac{Cin}{Cfb}\right)}{s + \frac{1}{Rfb \times Cfb}}$$

Wherein Rfb means the resistance value provided by the feedback circuit 110, and the cut-off frequency $f_{-3\ dB}$ is determined based on the following equation:

$$f_{-3dB} = \frac{1}{2\pi \times Rfb \times Cfb}$$

In some application fields such as audio signal processing, it may be required to maintain the cut-off frequency $f_{-3\ dB}$ as a low or lower frequency. For example, the cut-off frequency $f_{-3\ dB}$ may be kept to be lower than 20 KHz if the amplifier circuit 100 is applied for processing audio signal(s) since the audio band is almost at 20 Hz-20 KHz. To maintain the cut-off frequency $f_{-3\ dB}$ as a low or lower frequency, the amplifier circuit 100 as the novel DC-coupled PGA is arranged to employ the feedback circuit 110 as the resistor element capable of providing the large or larger resistance Rfb, and thus it is not necessary to increase the capacitance of Cfb for maintaining the cut-off frequency $f_{-3\ dB}$ as a low or lower frequency. In some situations, the capacitance of Cfb can be designed to be smaller. Circuit costs can be reduced.

It should be noted that maintaining the cut-off frequency $f_{-3\ dB}$ as a low or lower frequency is merely used for explaining one of the advantages provided by the amplifier circuit 100 for the field of audio signal processing, but this is not meant to be a limitation of the invention.

Specifically, the feedback circuit 110 comprises a novel switched-capacitor resistor circuit 1101 and a voltage scaling circuit 1102. The switched-capacitor resistor circuit 1101 is configured for simulating a feedback resistor element to provide a resistance for a feedback path of the amplifier 105 by using at least one capacitor placed between the input of the amplifier 105 and the output of the amplifier 105 to avoid leakage current(s) flowing back to the input of the amplifier 105. The switched-capacitor resistor circuit 1101 comprises a storage block 1101A and an inverting circuit 1104. The storage block 1101A comprises switches P1-P4 and a capacitor 1103 with capacitance CS used for signal isolation to avoid the channel leakage currents. The switched-capacitor resistor circuit 1101 is used as a novel switched-capacitor resistor capable of providing a larger or larger resistance Rfb' and is further used for providing a signal channel isolation function for its input and output, to avoid channel leakage currents. The voltage scaling circuit 115 is coupled to one end of the switched-capacitor resistor circuit 1101 and used for scaling down the amplitude of the signal Vout at output of the amplifier 105 to generate a signal Vout/M to the switched-capacitor resistor circuit 1101, to simulate the function of a resistor element for providing a resistance. The resistance Rfb provided by the feedback circuit 110 is determined according to the resistance of switched-capacitor resistor circuit 1101 and the resistance provided by the voltage scaling circuit 1102 connected in series.

The switched-capacitor resistor circuit 1101 comprises a single stage of novel switched-capacitor resistor, i.e. the block 1101A, which consists of the switches P1-P4 and the capacitor 1103. The on/off states of switches P1-P4 are controlled by a clock frequency signal with frequency Fclk. For some application fields such as audio signal processing, the frequency Fclk is determined to be higher than twice the frequency 20 KHz to avoid signal aliasing since the frequency band of audio signals almost ranges from 20 Hz to 20 KHz. However, this is not meant to be a limitation.

When the switches P1 and P2 are turned on simultaneously, the switches P3 and P4 are turned off simultaneously. Instead, when the switches P1 and P2 are turned off simultaneously, the switches P3 and P4 are turned on simultaneously. For example, when the clock frequency signal is at a rising edge, the switches P1 and P2 are turned on to be closed, and the switches P3 and P4 are turned off to be open. The first end of capacitor 1103 is connected to the voltage signal at the input of the amplifier 105, and the second end of capacitor 1103 is connected to a reference level VCM1; the reference level VCM1 can be a ground level. When the clock frequency signal is at a falling edge following the rising edge, the switches P1 and P2 are turned off to be open, and the switches P3 and P4 are turned on to be closed. The first end of capacitor 1103 is instantaneously disconnected from the voltage signal at the input of the amplifier 105 and connected to a reference level VCM2; the reference levels VCM1 and VCM2 can be identical or different. In addition, the second end of capacitor is instantaneously disconnected from the reference level VCM1 and connected to the output of voltage scaling circuit 1102 via the inverting circuit 1104. The inverting circuit 1104 at its input receives the output signal Vout/M of the voltage scaling circuit 1102 to generate a signal which is inverted from the signal Vout/M. It should be noted that the state of each switch mentioned above controlled by rising edges and falling edges is merely as an example for illustrative purposes and is not meant to be a limitation of the invention.

The switched-capacitor resistor circuit 1101 equivalently can provide a resistance value without resulting in channel leakage current(s) since the capacitor 1103 can be used for signal isolation to avoid resulting in a direct feedback circuit path from the output of the amplifier 105 to its input. The resistance Rfb' provided by switched-capacitor resistor circuit 1101 can be determined based on the following equation:

$$Rfb' = \frac{1}{Cs \times Fclk}$$

Cs represents the capacitance of capacitor 1103, and Fclk represents the frequency of the clock frequency signal. Since of the operation of the capacitor 1103, there is no direct signal path between the input of amplifier 105 and its output and, no channel leakage currents pass to the input of the amplifier 105.

The voltage scaling circuit 1102 is arranged for scaling down the amplitude Vout of the signal at the output of the amplifier 105 to generate a feedback signal having the voltage amplitude Vout/M (i.e. one M-th of the original amplitude Vout) to the switched-capacitor resistor circuit 1101. The voltage scaling circuit 1102 equivalently is used as a resistor circuit since it scales down the voltage amplitude Vout.

Thus, based on the operations of switched-capacitor resistor circuit 1101 and voltage scaling circuit 1102, the feedback circuit 100 is able to provide the large or larger resistance value Rfb. It should be noted that one of the switched-capacitor resistor circuit 1101 and voltage scaling circuit 1102 can be optional if considering use fewer circuit costs to implement the circuit 110. That is, in other embodiment, the feedback circuit 110 may include the switched-capacitor resistor circuit 1101 but exclude the voltage scaling circuit 1102; one end of switched-capacitor resistor circuit 1101 is directly connected to the output of the amplifier 105. Alternatively, the feedback circuit 110 may include the voltage scaling circuit 1102 but exclude the switched-capacitor resistor circuit 1101; the output of voltage scaling circuit 1102 is directly connected to the input of the amplifier 105. These modifications can also provide the larger resistance and falls within the scope of the invention. Additionally, in other embodiment, the positions of block 1101A and inverting circuit 1104 can be exchanged. That is, the inverting circuit 1104 can coupled between the storage block 1101A and the input of the amplifier 105.

It should be noted that the structure of feedback circuit 110 can be also applied to a differential amplifier. For example, two feedback circuits each having the structure of feedback circuit 110 can be respectively placed on different feedback paths of the differential amplifier to achieve the functions and advantages mentioned above.

Figure 2A:
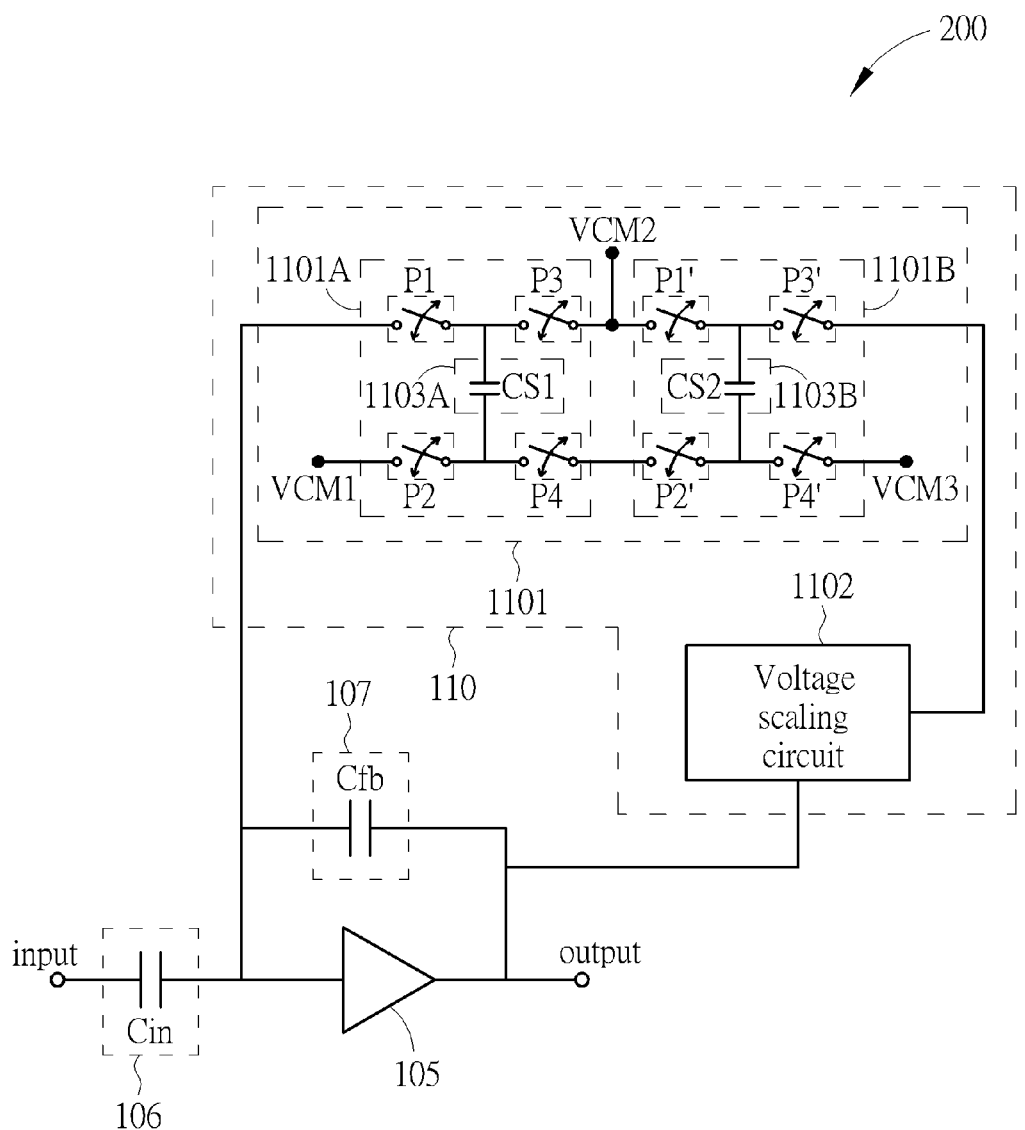
FIG. 2A is a diagram of programmable amplifier circuit according to a second embodiment of the invention.
Figure 2B:
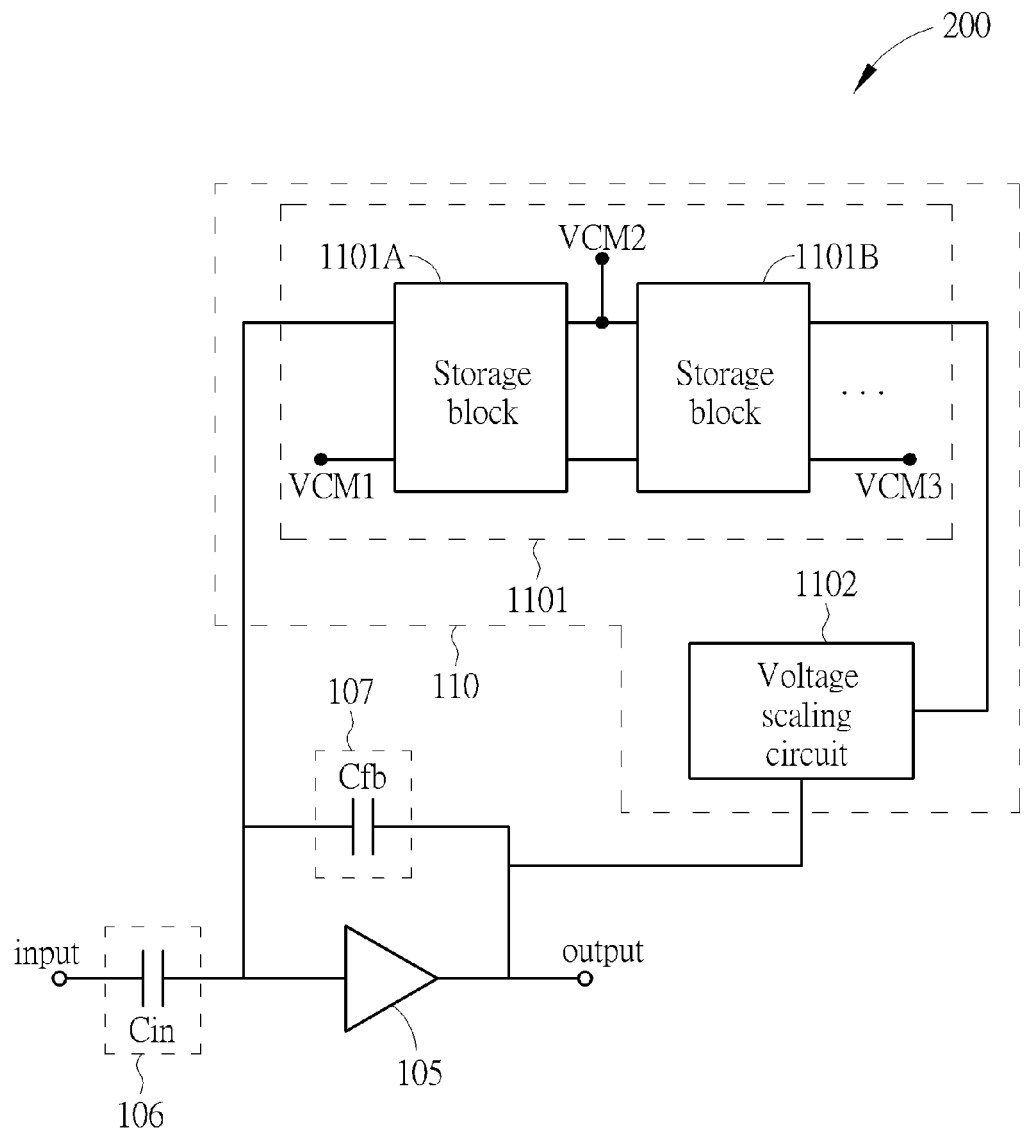
FIG. 2B is another diagram of programmable amplifier circuit according to a second embodiment of the invention.

Additionally, in other embodiments, a plurality of storage blocks can be employed. For example, another stage of novel switched-capacitor resistor can be employed with the switches P1-P4 and capacitor 1103 to form a cascade structure of novel switched-capacitor resistors (i.e. two stages of novel switched-capacitor resistors), and the inverting circuit 1104 is not required. FIG. 2A and FIG. 2B are diagrams of amplifier circuits 200A and 200B according to a second embodiment of the invention. The switched-capacitor resistor circuit 1101 consists of a cascade structure of multiple novel switched-capacitor resistors. The switched-capacitor resistor circuit 1101 comprises multiple storage blocks 1101A connected in series to form the cascade structure. FIG. 2A shows two storage blocks connected in series. FIG. 2B shows more than two storage blocks connected in series.

As shown in FIG. 2A, the switched-capacitor resistor circuit 1101 includes two storage blocks 1101A and 1101B connected in series wherein the storage block 1101A consists of switches P1-P4 and capacitor 1103A and the storage block 1101B consists of switches P1'-P4' and capacitor 1103B. ON/OFF states of switches P1-P4 and P1'-P4' are controlled by a clock frequency signal with frequency Fclk. When the switches P1 and P2 are turned on simultaneously, the switches P3 and P4 are turned off simultaneously. Instead, when the switches P1 and P2 are turned off simultaneously, the switches P3 and P4 are turned on simultaneously. Similarly, when the switches P1' and P2' are turned on simultaneously, the switches P3' and P4' are turned off simultaneously. Instead, when the switches P1' and P2' are turned off simultaneously, the switches P3' and P4' are turned on simultaneously.

For example, when the clock frequency signal is at a rising edge, the switches P1 and P2 are turned on to be closed, and the switches P3 and P4 are turned off to be open. The first end of capacitor 1103A is connected to the input of the amplifier 105, and the second end of capacitor 1103A is connected to the reference level VCM1. When the clock frequency signal is at a falling edge following the rising edge, the switches P1 and P2 are turned off to be open, and the switches P3 and P4 are turned on to be closed. The first end of capacitor 1103A is instantaneously disconnected from the input of the amplifier 105 and connected to the reference level VCM2. In addition, the second end of capacitor 1103A is instantaneously disconnected from the reference level VCM1 and connected to an intermediate node between switches P4 and P2'. When the clock frequency signal is at another rising edge following the falling edge, the switches P1' and P2' are turned on to be closed, and the switches P3 and P4 are turned off to be open. The first end of capacitor 1103B is connected to the reference level VCM2, and the second end of capacitor 1103B is connected to the intermediate node between switches P4 and P2'. When the clock frequency signal is at another falling edge following the previous rising edge, the switches P1' and P2' are turned off to be open, and the switches P3' and P4' are turned on to be closed. The first end of capacitor 1103B is instantaneously disconnected from the reference level VCM2 and connected to one end of the voltage scaling circuit 1102. In addition, the second end of capacitor 1103B is instantaneously disconnected from the intermediate node between switches P4 and P2', and is connected to the reference level VCM3. Thus, by the cascade structure of two stages of novel switched-capacitor resistors, this can avoid channel leakage currents effectively without using an inverting circuit. It should be noted that the reference levels VCM1, VCM2, and VCM3 can be configured to be identical or different. In addition, the state of each switch mentioned above controlled by rising edges and falling edges is merely as an example for illustrative purposes and is not meant to be a limitation of the invention.

Figure 3:
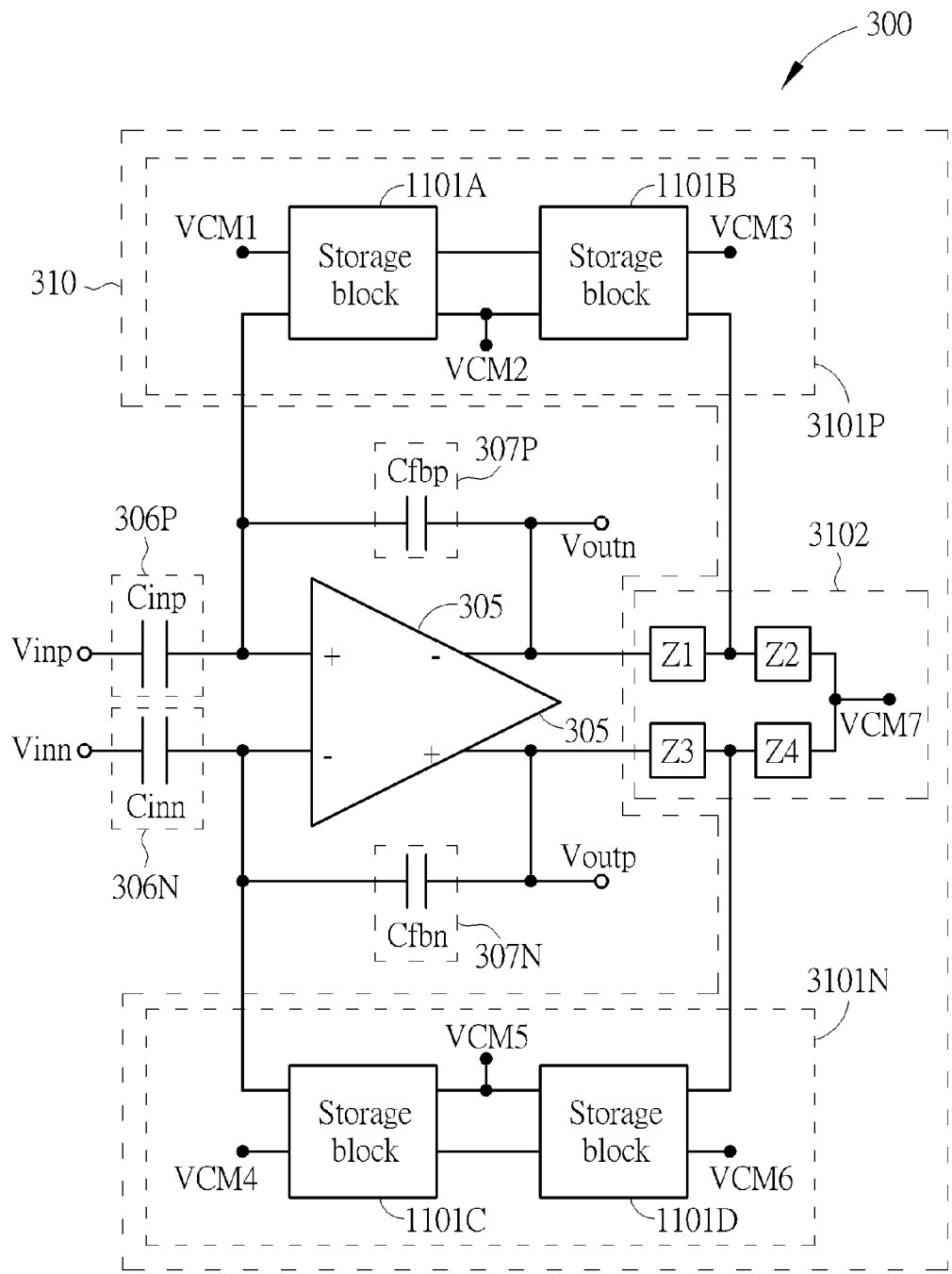
FIG. 3 is a diagram of programmable amplifier circuit according to a third embodiment of the invention.

Furthermore, in other embodiments, the cascade structure of the novel switched-capacitor resistors and the voltage scaling circuit can be applied to a differential amplifier. FIG. 3 is a diagram of an amplifier circuit 300 according to a third embodiment of the invention. The amplifier circuit 300 comprises a differential amplifier 305, a pair of input capacitors 306P and 306N respectively including capacitances Cinp and Cinn, a pair of feedback capacitors 307P and 307N respectively having capacitances Cfbp and Cfbn, and a feedback circuit 310 wherein the feedback circuit 310 comprises a voltage scaling circuit 3102 (comprising impedance units Z1-Z4) and a pair of switched-capacitor resistor circuits 3101P and 3101N each having the cascade structure of multiple novel switched-capacitor resistors. The input capacitors 306P and 306N are respectively connected between the differential input signals Vinp and Vinn and the positive and negative inputs of the amplifier 305, and the feedback capacitors 307P and 307N are respectively connected between the positive input and negative output of the amplifier 305 and the negative input and positive output of the amplifier 305, as illustrated in FIG. 3.

The switched-capacitor resistor circuit 3101P is configured for simulating a first feedback resistor element to provide a resistance for a first feedback path of the differential amplifier 305 by using at least one capacitor placed to avoid channel leakage current(s) flowing back to an input of the differential amplifier 305. The switched-capacitor resistor circuit 3101N is configured for simulating a second feedback resistor element to provide a resistance for a second feedback path of the differential amplifier by using at least one capacitor to avoid channel leakage current(s) flowing back to another input of the differential amplifier 305. The switched-capacitor resistor circuit 3101P consists of the cascade structure of two storage blocks 1101A and 1101B, and the switched-capacitor resistor circuit 3101N consists of the cascade structure of two storage blocks 1101C and 1101D. Each storage block is implemented based on the structure of storage block 1101A as shown in FIG. 1; further description is not detailed for brevity.

The voltage scaling circuit 3102 comprises impedance units Z1-Z4 such as resistors and/or other impedance circuits. The impedance unit Z1 is connected between the negative output Voutn of amplifier 305 and one end of the storage block 1101B, and the impedance unit Z2 is connected between one end of the storage block 1101B and the reference level VCM7 such as a common mode voltage. In addition, the impedance unit Z3 is connected between the positive output Voutp of amplifier 305 and one end of the storage block 1101D, and the impedance unit Z4 is connected between one end of the storage unit 1101D and the reference level VCM7. Through impedance units Z1 and Z2, the voltage amplitude of the output signal at Voutn can be scaled down. Through impedance units Z3 and Z4, the voltage amplitude of the output signal at Voutp can be scaled down. The voltage scaling circuit 3102 equivalently provides a resistor function. It should be noted that the implementation of voltage scaling circuit 3102 is merely used for illustrative purpose and not meant to be a limitation.

Figure 4:
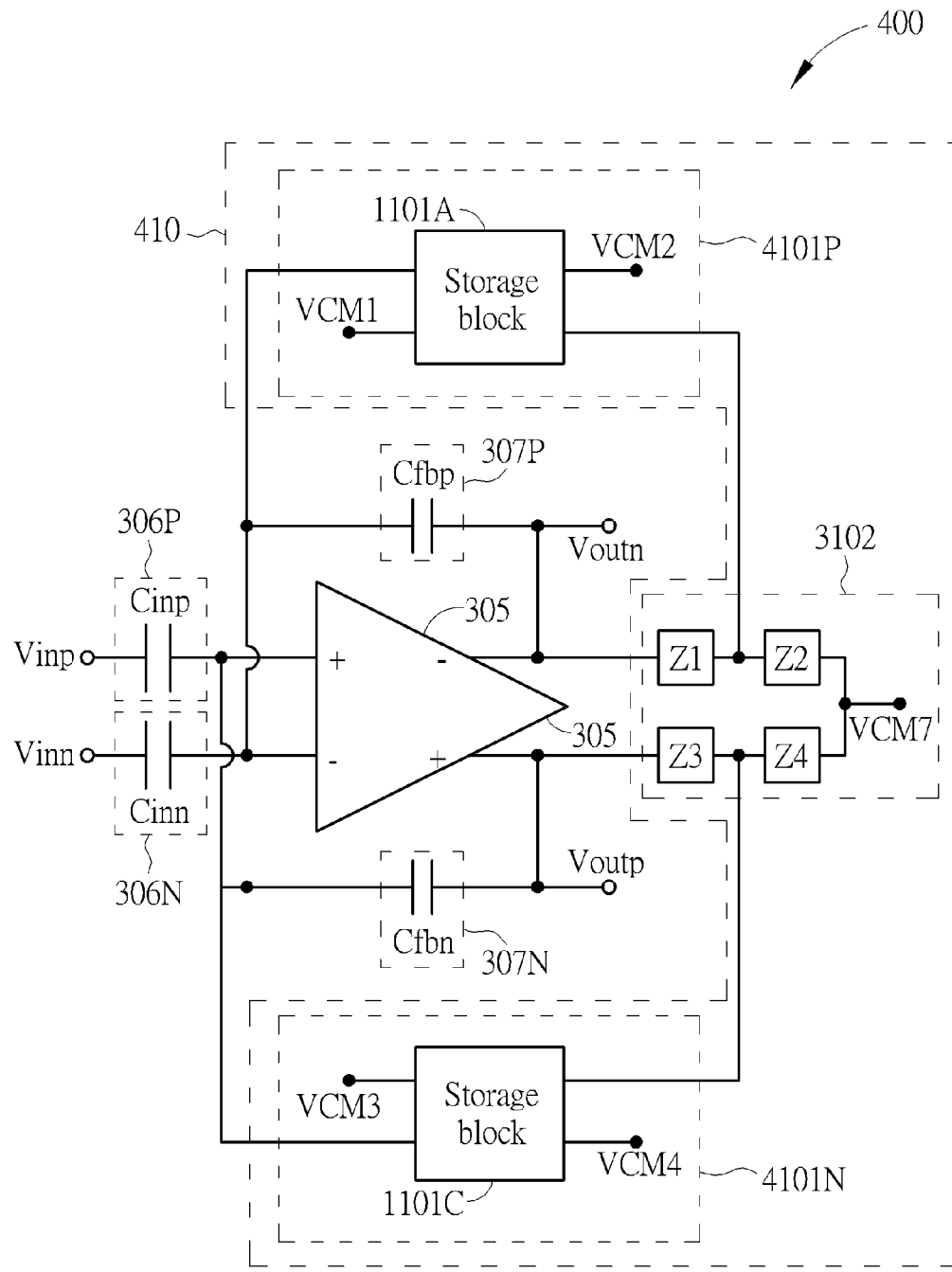
FIG. 4 is a diagram of programmable amplifier circuit according to a fourth embodiment of the invention.

Furthermore, a single stage of novel switched-capacitor resistor structure can be applied to a differential amplifier. FIG. 4 is a diagram of an amplifier circuit 400 according to a fourth embodiment of the invention. The amplifier circuit 400 comprises the differential amplifier 305, the pair of input capacitors 306P and 306N respectively including capacitances Cinp and Cinn, the pair of feedback capacitors 307P and 307N respectively having capacitances Cfbp and Cfbn, and a feedback circuit 410 wherein the feedback circuit 410 comprises a voltage scaling circuit 3102 (comprising impedance units Z1-Z4) and a pair of switched-capacitor resistor circuits 4101P and 4101N each having a single stage of novel switched-capacitor resistor. The switched-capacitor resistor circuit 4101P consists of a single storage block 1101A, and the switched-capacitor resistor circuit 4101N consists of a single storage block 1101C. The input of switched-capacitor resistor circuit 4101P and the input of capacitor 307P are connected to the negative input of the amplifier 305, and the input of switched-capacitor resistor circuit 4101N and the input of capacitor 307N are connected to the positive input of the amplifier 305, as shown on FIG. 4. No inverting circuit 1104 is needed.

Figure 5:
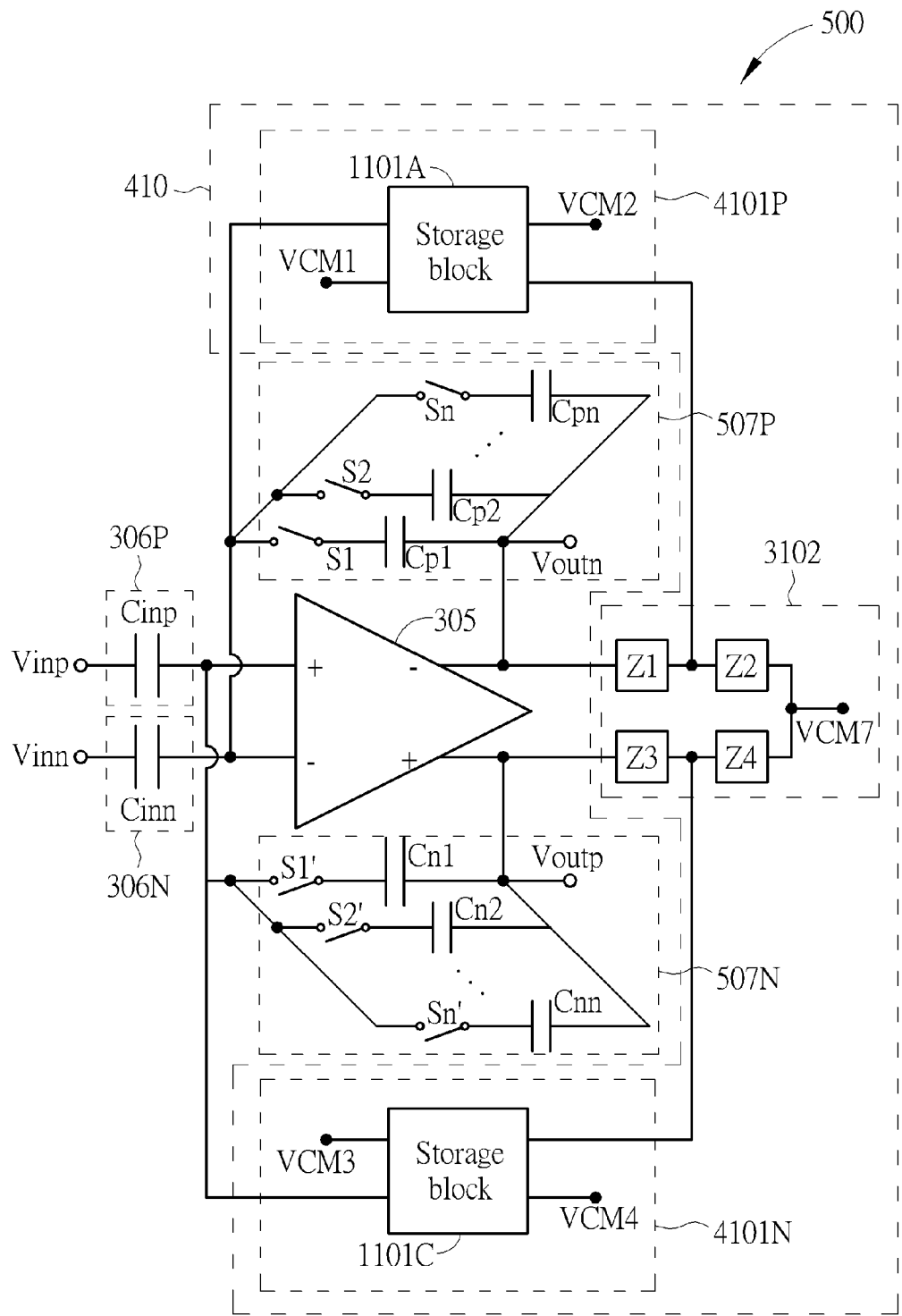
FIG. 5 is a diagram of programmable amplifier circuit according to a fifth embodiment of the invention.

Furthermore, in other embodiments, a feedback capacitor coupled between the input and output of an amplifier can be implemented using a set of switches and a corresponding programmable capacitor array, to avoid leakage currents occurring at the path of feedback capacitor and to make the capacitance of feedback capacitor be programmable. FIG. 5 is a diagram of an amplifier circuit 500 according to a fifth embodiment of the invention. The amplifier circuit 500 comprises the differential amplifier 305, the pair of input capacitors 306P and 306N, the feedback circuit 410, and a pair of feedback capacitors 507P and 507N. The feedback capacitor 507P comprises a plurality of switches S1-Sn and a capacitor array including a plurality of capacitors Cp1-Cpn. The feedback capacitor 507N comprises a plurality of switches S1'-Sn' and a capacitor array including a plurality of capacitors Cn1-Cnn. The switches S1-Sn and S1'-Sn' are user-selectable. For example, a user may select the paths of switches S1, S1' and corresponding capacitors Cp1, Cn1, to turn on the switches S1, S1' to be closed and turnoff the other switches, so as to configure the capacitances of feedback capacitors 507P and 507N as Cp1 and Cn1 respectively.

Figure 6:
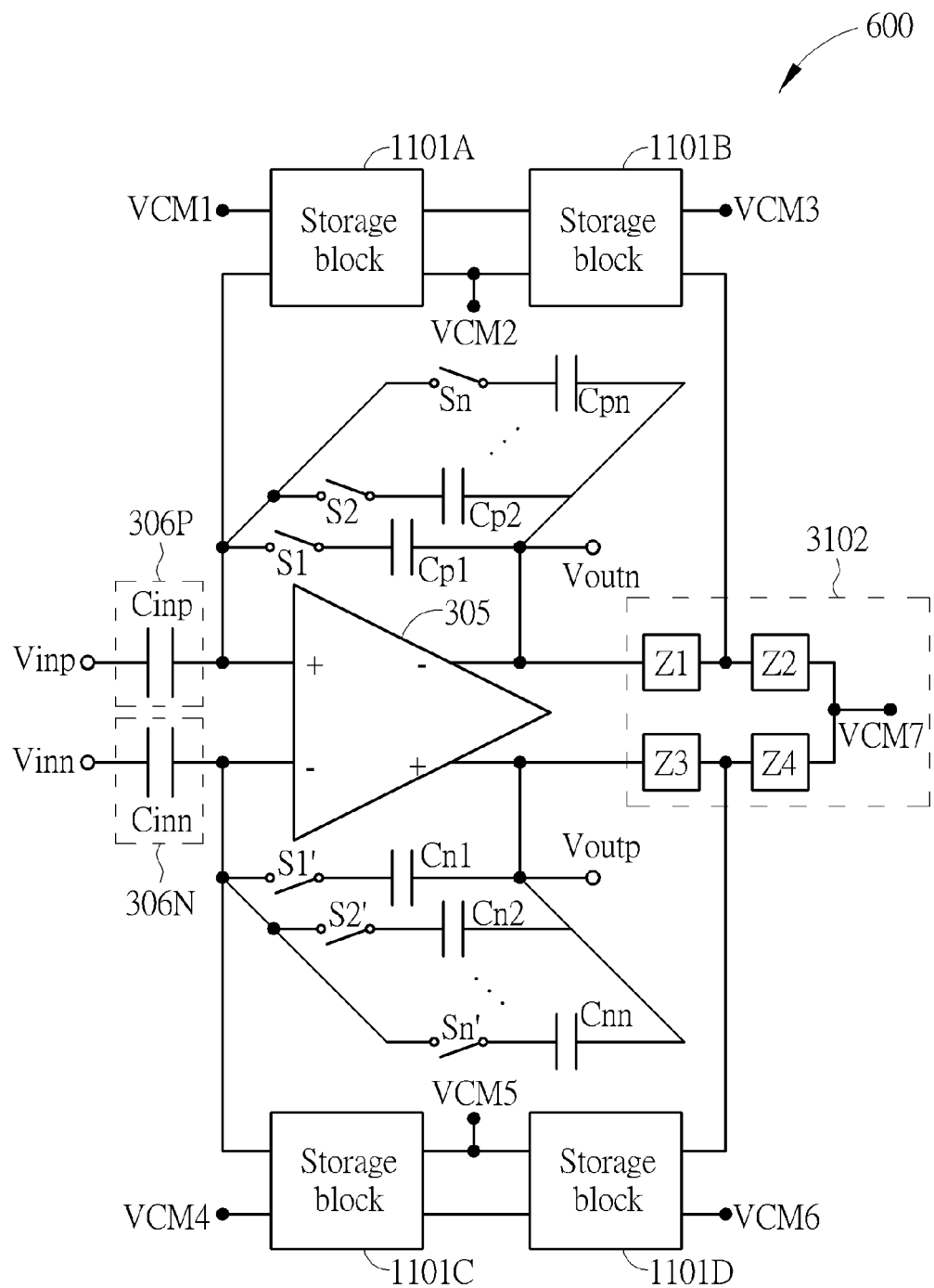
FIG. 6 is a diagram of programmable amplifier circuit according to a sixth embodiment of the invention.

Additionally, in other embodiments, the cascade structure of novel switched-capacitor resistors and a set of switches and a corresponding programmable capacitor array can be combined and used with a differential amplifier. FIG. 6 is a diagram of an amplifier circuit 600 according to a sixth embodiment of the invention. The amplifier circuit 600 comprises the differential amplifier 305, the pair of input capacitors 306P and 306N, a feedback circuit having the cascade structure of novel switched-capacitor resistors, and a pair of feedback capacitors each being implemented by a set of switches and corresponding programmable capacitor array. The functions and operations of circuit elements of FIG. 6 are similar to those of FIG. 3 and FIG. 5. Detailed description is not described for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A programmable amplifier circuit, comprising:
an amplifier;
an input capacitor, coupled to an input of the amplifier, for receiving an input signal;
a feedback capacitor, coupled to the input of the amplifier and an output of the amplifier;
a switched-capacitor resistor circuit coupled to the input of the amplifier and the output of the amplifier; and
a voltage scaling circuit, coupled between the input of the amplifier and the output of the amplifier, configured for simulating a feedback resistor element to scale down a voltage amplitude of a signal generated from the output of the amplifier to generate a feedback signal to the input of the amplifier;
wherein the voltage scaling circuit comprises:
a first impedance unit, coupled to the output of the amplifier; and
a second impedance unit, coupled between the first impedance unit and a reference level; wherein an intermediate node between the first impedance unit and the second impedance unit is coupled to the feedback signal to be generated to the input of the amplifier.

2. A programmable amplifier circuit, comprising:
an amplifier;
an input capacitor, coupled to an input of the amplifier, for receiving an input signal;
a feedback capacitor, coupled to the input of the amplifier and an output of the amplifier; and
a switched-capacitor resistor circuit, coupled between the input of the amplifier and the output of the amplifier, configured for simulating a feedback resistor element to provide a resistance for a feedback path of the amplifier by using at least one capacitor placed between the input of the amplifier and the output of the amplifier to avoid leakage current(s) flowing back to an input of the amplifier;
wherein the switched-capacitor resistor circuit comprises:
a storage block, couple to the input of the amplifier, for using a first capacitor placed between the input of the amplifier and the output of the amplifier to avoid leakage current(s) flowing the feedback path; and
an inverting circuit, coupled to one end of the storage block, for inverting a signal generated from the output of the amplifier to generate a feedback signal to the storage block, or for inverting a signal generated from the storage block to generate a signal to the input of the amplifier.

3. The programmable amplifier circuit of claim 2, wherein the storage block comprises:
the first capacitor;
a first switch, selectively coupled between the input of the amplifier and a first end of the first capacitor;
a second switch, selectively coupled between a reference level and a second end of the first capacitor;
a third switch, selectively coupled between the reference level and the first end of the first capacitor; and
a fourth switch, selectively coupled between the second end of the first capacitor and one end of the storage block.

4. The programmable amplifier circuit of claim 3, wherein the first switch and the second switch are turned on when the third switch and the fourth switch are turned off, and the first switch and the second switch are turned off when the third switch and the fourth switch are turned on.

5. The programmable amplifier circuit of claim 4, wherein when a clock frequency signal is at a rising edge, the first switch and the second switch are turned on, and the third switch and the fourth switch are turned off; and, when the clock frequency signal is at a falling edge, the first switch and the second switch are turned off, and the third switch and the fourth switch are turned on.

6. A programmable amplifier circuit, comprising:
an amplifier;
an input capacitor, coupled to an input of the amplifier, for receiving an input signal;
a feedback capacitor, coupled to the input of the amplifier and an output of the amplifier; and
a switched-capacitor resistor circuit, coupled between the input of the amplifier and the output of the amplifier, configured for simulating a feedback resistor element to provide a resistance for a feedback path of the amplifier by using at least one capacitor placed between the input of the amplifier and the output of the amplifier to avoid leakage current(s) flowing back to an input of the amplifier;
wherein the switched-capacitor resistor circuit comprises:
a plurality of storage blocks, coupled between the input of the amplifier and the output of the amplifier, for respectively using a plurality of capacitors placed between the input of the amplifier and the output of the amplifier to the avoid leakage current(s);
wherein the plurality of storage blocks are connected in a cascaded structure.

7. The programmable amplifier circuit of claim 6, wherein the plurality of storage blocks comprise:
a first storage block, couple to the input of the amplifier, for using a first capacitor placed between the input of the amplifier and the output of the amplifier to avoid leakage current(s) flowing the feedback path; and
a second storage block, couple between the first storage block and the output of the amplifier, for using a second capacitor placed between the input of the amplifier and the output of the amplifier to avoid leakage current(s) flowing the feedback path;
wherein the first storage block is connected to the second storage block in a cascaded structure.

8. The programmable amplifier circuit of claim 6, wherein each storage block further comprises:
a first switch, selectively coupled to a first end;
a second switch, selectively coupled between a reference level and a second end;
a third switch, selectively coupled between the reference level and the first end; and
a fourth switch, selectively coupled to the second end;
wherein the first end and the second end are two ends of one capacitor used by said each storage block.

9. The programmable amplifier circuit of claim 2, further comprising:
a voltage scaling circuit, coupled between the switched-capacitor resistor circuit and the output of the amplifier, configured for simulating a feedback resistor element to scale down a voltage amplitude of a signal generated from the output of the amplifier to generate a feedback signal to the switched-capacitor resistor circuit.

10. A programmable amplifier circuit, comprising:
a differential amplifier;
a first input capacitor, coupled to a positive input of the differential amplifier, for receiving a first input signal;
a second input capacitor, coupled to a negative input of the differential amplifier, for receiving a second input signal;
a first feedback capacitor, coupled to the positive input of the differential amplifier and a negative output of the differential amplifier;
a second feedback capacitor, coupled to the negative input of the differential amplifier and a positive output of the differential amplifier;
a first switched-capacitor resistor circuit, coupled between the positive input of the differential amplifier and the negative output of the differential amplifier, configured for simulating a first feedback resistor element to provide a resistance for a first feedback path of the differential amplifier by using at least one capacitor placed between the positive input of the amplifier and the negative output of the amplifier to avoid leakage current(s) flowing back an input of the differential amplifier; and
a second switched-capacitor resistor circuit, coupled between the negative input of the differential amplifier and the positive output of the differential amplifier, configured for simulating a second feedback resistor element to provide a resistance for a second feedback path of the differential amplifier by using at least one capacitor placed between the negative input of the amplifier and the positive output of the amplifier to avoid leakage current(s) flowing back to another input of the differential amplifier;

wherein each switched-capacitor resistor circuit comprises:
- a storage block, for using a specific capacitor to avoid leakage current(s) flowing the first feedback path or the second feedback path; and
- an inverting circuit, coupled to one end of the storage block, for inverting a signal generated from an output of the differential amplifier to generate a feedback signal to the storage block, or for inverting a signal generated from the storage block to generate a signal to an input of the differential amplifier.

11. The programmable amplifier circuit of claim 10, wherein the storage block comprises:
- the specific capacitor;
- a first switch, selectively coupled to a first end of the specific capacitor;
- a second switch, selectively coupled between a first reference level and a second end of the specific capacitor;
- a third switch, selectively coupled between a second reference level and the first end of the specific capacitor; and
- a fourth switch, selectively coupled to the second end of the specific capacitor.

12. The programmable amplifier circuit of claim 11, wherein the first switch and the second switch are turned on when the third switch and the fourth switch are turned off, and the first switch and the second switch are turned off when the third switch and the fourth switch are turned on.

13. The programmable amplifier circuit of claim 12, wherein when a clock frequency signal is at a rising edge, the first switch and the second switch are turned on, and the third switch and the fourth switch are turned off; and, when the clock frequency signal is at a falling edge, the first switch and the second switch are turned off, and the third switch and the fourth switch are turned on.

14. A programmable amplifier circuit, comprising:
- a differential amplifier;
- a first input capacitor, coupled to a positive input of the differential amplifier, for receiving a first input signal;
- a second input capacitor, coupled to a negative input of the differential amplifier, for receiving a second input signal;
- a first feedback capacitor, coupled to the positive input of the differential amplifier and a negative output of the differential amplifier;
- a second feedback capacitor, coupled to the negative input of the differential amplifier and a positive output of the differential amplifier;
- a first switched-capacitor resistor circuit, coupled between the positive input of the differential amplifier and the negative output of the differential amplifier, configured for simulating a first feedback resistor element to provide a resistance for a first feedback path of the differential amplifier by using at least one capacitor placed between the positive input of the amplifier and the negative output of the amplifier to avoid leakage current(s) flowing back an input of the differential amplifier; and
- a second switched-capacitor resistor circuit, coupled between the negative input of the differential amplifier and the positive output of the differential amplifier, configured for simulating a second feedback resistor element to provide a resistance for a second feedback path of the differential amplifier by using at least one capacitor placed between the negative input of the amplifier and the positive output of the amplifier to avoid leakage current(s) flowing back to another input of the differential amplifier;

wherein each switched-capacitor resistor circuit comprises:
- a first storage block, couple to one among the positive input and the negative input of the differential amplifier, for using a first capacitor to avoid leakage current(s) flowing the first feedback path or the second feedback path; and
- a second storage block, couple between the first storage block and one among the positive output and the negative output of the differential amplifier, for using a second capacitor to avoid leakage current(s) flowing the first feedback path or the second feedback path;

wherein the first storage block is connected to the second storage block in a cascaded structure.

15. The programmable amplifier circuit of claim 14, wherein each storage block further comprises:
- a first switch, selectively coupled to one input of the differential amplifier and a first end;
- a second switch, selectively coupled between a first reference level and a second end;
- a third switch, selectively coupled between a second reference level and the first end; and
- a fourth switch, selectively coupled to the second end;

wherein the first end and the second end are two ends of the first capacitor for the first storage block or two ends of the second capacitor for the second storage block.

16. The programmable amplifier circuit of claim 10, further comprising:
- a voltage scaling circuit, coupled between the first switched-capacitor resistor circuit, the second switched-capacitor resistor circuit, and the positive output and the negative output of the differential amplifier, configured for simulating two feedback resistor elements to scale down a voltage amplitude of a signal generated from the negative output of the differential amplifier to generate a first feedback signal to the first switched-capacitor resistor circuit and to scale down a voltage amplitude of a signal generated from the positive output of the differential amplifier to generate a second feedback signal to the second switched-capacitor resistor circuit.

17. A programmable amplifier circuit, comprising:
- a differential amplifier;
- a first input capacitor, coupled to a positive input of the differential amplifier, for receiving a first input signal;
- a second input capacitor, coupled to a negative input of the differential amplifier, for receiving a second input signal;
- a first feedback capacitor, coupled to the positive input of the differential amplifier and a negative output of the differential amplifier;
- a second feedback capacitor, coupled to the negative input of the differential amplifier and a positive output of the differential amplifier;
- a first switched-capacitor resistor circuit, coupled between the negative input of the differential amplifier and the negative output of the differential amplifier, configured for simulating a first feedback resistor element to provide a resistance for a first feedback path of the differential amplifier by using at least one capacitor placed between the positive input of the differential amplifier and the negative output of the differential amplifier to avoid leakage current(s) flowing back to an input of the differential amplifier; and a second switched-capacitor resistor circuit, coupled between the positive input of the differential amplifier and the positive output of the differential amplifier, configured for simulating a second feedback resistor element to provide a resistance for a second feedback path of the differential amplifier by using at least one capacitor placed between the negative input of the differential amplifier and the positive output of the differential amplifier to avoid leakage current(s) flowing back to another input of the differential amplifier.

18. The programmable amplifier circuit of claim 17, wherein each switched-capacitor resistor circuit comprises:
a single storage block, for using a specific capacitor to avoid the leakage current(s).

* * * * *